United States Patent
Hsu et al.

(10) Patent No.: US 12,313,696 B2
(45) Date of Patent: May 27, 2025

(54) TEST LOAD CIRCUIT

(71) Applicant: Quanta Computer Inc., Taoyuan (TW)

(72) Inventors: Kuo-Chan Hsu, Taoyuan (TW); Yun-Teng Shih, Taoyuan (TW); Chia-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 186 days.

(21) Appl. No.: 18/155,586

(22) Filed: Jan. 17, 2023

(65) Prior Publication Data
US 2024/0241189 A1    Jul. 18, 2024

(51) Int. Cl.
G01R 31/40       (2020.01)
G01R 31/319      (2006.01)
G01R 31/3193     (2006.01)

(52) U.S. Cl.
CPC ....... *G01R 31/40* (2013.01); *G01R 31/31924* (2013.01); *G01R 31/31932* (2013.01)

(58) Field of Classification Search
CPC ........ G01R 31/31924; G01R 31/31932; G01R 31/40
See application file for complete search history.

(56) References Cited

U.S. PATENT DOCUMENTS

2002/0071232 A1*   6/2002   Andrews ........... H01M 10/4285
                                                     324/762.09
2013/0308240 A1    11/2013  Yu et al.
2019/0238124 A1*   8/2019   Tajima ..................... G01K 3/14

FOREIGN PATENT DOCUMENTS

| CN | 103424580 A | 12/2013 |
| CN | 108267622 A | 7/2018 |
| CN | 114755469 A | 7/2022 |
| TW | 201346305 A | 11/2013 |

OTHER PUBLICATIONS

TW Office Action for Application No. 112114045, mailed Feb. 5, 2024, w/ First Office Action Summary, 9 pp.
TW Search Report for Application No. 112114045, mailed Feb. 5, 2024, w/ First Office Action, 1 p.

* cited by examiner

*Primary Examiner* — Judy Nguyen
*Assistant Examiner* — Adam S Clarke
(74) *Attorney, Agent, or Firm* — NIXON PEABODY LLP

(57) ABSTRACT

A test load circuit includes a test load, a current sensor, and comparator. The test load is connected to a voltage source of a power supply. The current sensor is configured to detect the amount of current flowing through the test load. The comparator has a first input connected to a feedback signal having a voltage associated with the test load current, a second input connected to a command signal having has a voltage associated with a target current through the test load, and an output connected to the test load. The output of the comparator has a voltage that is based on the current difference between the target current and the test load current. The test load has a variable resistance that is controllable by the output of the comparator to adjust the test load current and cause the test load current to match the target current.

18 Claims, 4 Drawing Sheets

TEST LOAD CIRCUIT

FIELD OF THE INVENTION

The present invention relates generally to a test load circuit, and more specifically, to a test load circuit having a controllable load to test the function of a target device.

BACKGROUND OF THE INVENTION

Computing systems and devices often include a variety of electronic components that are powered by a power supply unit. Testing of these power supply units is critical to ensure that the power supply unit will function as intended for a variety of different operating conditions of the system or device that the power supply unit is being used with. However, during the design of a power supply unit, it can be dangerous to test the power supply unit with a real system or device, to avoid burning out system or device. Thus, new systems and devices are needed to allow for the testing of power supply units.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed toward a test load circuit for a power supply that includes a test load, a current sensor, and a comparator. The test load is configured to be electrically connected to a voltage source of the power supply. The current sensor is configured to detect an amount of current flowing through the test load. The comparator has a first input, a second input, and an output. The first input is electrically connected to a feedback signal, the feedback signal having a voltage that is associated with the test load current. The second input is electrically connected to a command signal, the command signal having a voltage that is associated with a target current through the test load. The output is electrically connected to the test load, the output having a voltage that is based at least in part on a current difference between the target current and the test load current. The test load has a variable resistance that is controllable by the output of the comparator to adjust test load current and cause the test load current to match the target current.

In some aspects of the first implementation, the resistance of the test load decreases such that the test load current increases to match the target current, in response to the command signal voltage increasing and indicating that the target current is greater than the test load current.

In some aspects of the first implementation, the resistance of the test load increases such that the test load current decreases to match the target current, in response to the command signal voltage decreasing and indicating that the target current is less than the test load current.

In some aspects of the first implementation, the command signal voltage is adjustable to modify the comparator output voltage.

In some aspects of the first implementation, the comparator output voltage transitions from a logical low voltage to a logical high voltage in response to the command signal voltage being modified from a first voltage that is less than the feedback signal voltage to a second voltage that is greater than the feedback signal voltage.

In some aspects of the first implementation, the comparator output voltage transitions from a logical high voltage to a logical low voltage in response to the command signal voltage being modified from a first voltage that is greater than the feedback signal voltage to a second voltage that is less than the feedback signal voltage.

In some aspects of the first implementation, the command signal voltage is adjustable to transition the comparator output voltage between a logical high voltage and a logical low voltage.

In some aspects of the first implementation, the resistance of the test load increases or decreases in response to the comparator output voltage transitioning between the logical high voltage and the logical low voltage.

In some aspects of the first implementation, the resistance of the test load decreases in response to the comparator output voltage transitioning from the logical low voltage to the logical high voltage.

In some aspects of the first implementation, the resistance of the test load increases in response to the comparator output voltage transitioning from the logical high voltage to the logical low voltage.

In some aspects of the first implementation, the test load current increases or decreases in response to the resistance of the test load increasing or decreasing.

In some aspects of the first implementation, the test load current increases in response to the resistance of the test load decreases, and decreases in response to the resistance of the test load increasing.

In some aspects of the first implementation, the feedback signal voltage increases or decreases in response to the test load current increasing or decreasing.

In some aspects of the first implementation, in response to the feedback signal voltage increasing above the command signal voltage, the resistance of the test load increases, such that the test load current decreases to match the target current voltage; and In some aspects of the first implementation, in response to the feedback signal voltage decreasing below the command signal voltage, the resistance of the test load decreases, such that the test load current increases to match the target current.

In some aspects of the first implementation, the test load circuit includes an amplifier with an input and an output. The input is electrically connected to the test load, and the output is electrically connected to the first input of the comparator. The amplifier is configured to amplify a voltage across the current sensor to generate the feedback signal at the output of the amplifier. The voltage across the current sensor is proportional to the test load current.

In some aspects of the first implementation, the test load is a metal-oxide-semiconductor field-effect transistor (MOSFET). The MOSFET includes a gate that is electrically connected to the output of the comparator such that the output of the comparator is controllable to adjust the resistance of the MOSFET.

In some aspects of the first implementation, the test load circuit includes a processing device that is configured to receive a user input indicative of the target current, and to adjust the command signal voltage based at least in part on the target current. The test load current is modified to match the target current in response to the command signal voltage being adjusted by the processing device.

In some aspects of the first implementation, the test load circuit includes a temperature sensor electrically connected to the processing device. The temperature sensor is positioned adjacent to the test load and is configured to monitor a temperature of the test load. The processing device is configured to decrease the command signal voltage in response to the test load temperature being greater than a threshold temperature.

In some aspects of the first implementation, the voltage source has a known voltage, and the target current is determined based on the voltage of the voltage source and a target power dissipation of the test load.

In a second implementation, the present disclosure is directed toward a method for adjusting an amount of current flowing through a test load. The method includes receiving user input indicative of a target current through the test load. The method further includes adjusting a voltage of a command signal based at least in part on the target current. The method further includes receiving a feedback signal, the feedback signal having a voltage that is associated with the test load current. The method further includes comparing the command signal voltage to the feedback signal voltage. The method further includes causing the test load current to increase in response to the command signal voltage being greater than the feedback signal voltage. The method further includes causing the test load current to decrease in response to the command signal voltage being less than the feedback signal voltage.

In some aspects of the second implementation, causing the test load current to increase includes increasing the voltage applied to the test load to cause the resistance of the test load to decrease.

In some aspects of the second implementation, causing the test load current to decrease includes decreasing the voltage applied to the test load to cause the resistance of the test load to increase.

In some aspects of the second implementation, the method further includes determining the voltage across a current sensor that is electrically connected to the test load. The current sensor voltage is associated with the test load current. The method further includes amplifying the current sensor voltage to generate the feedback signal.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
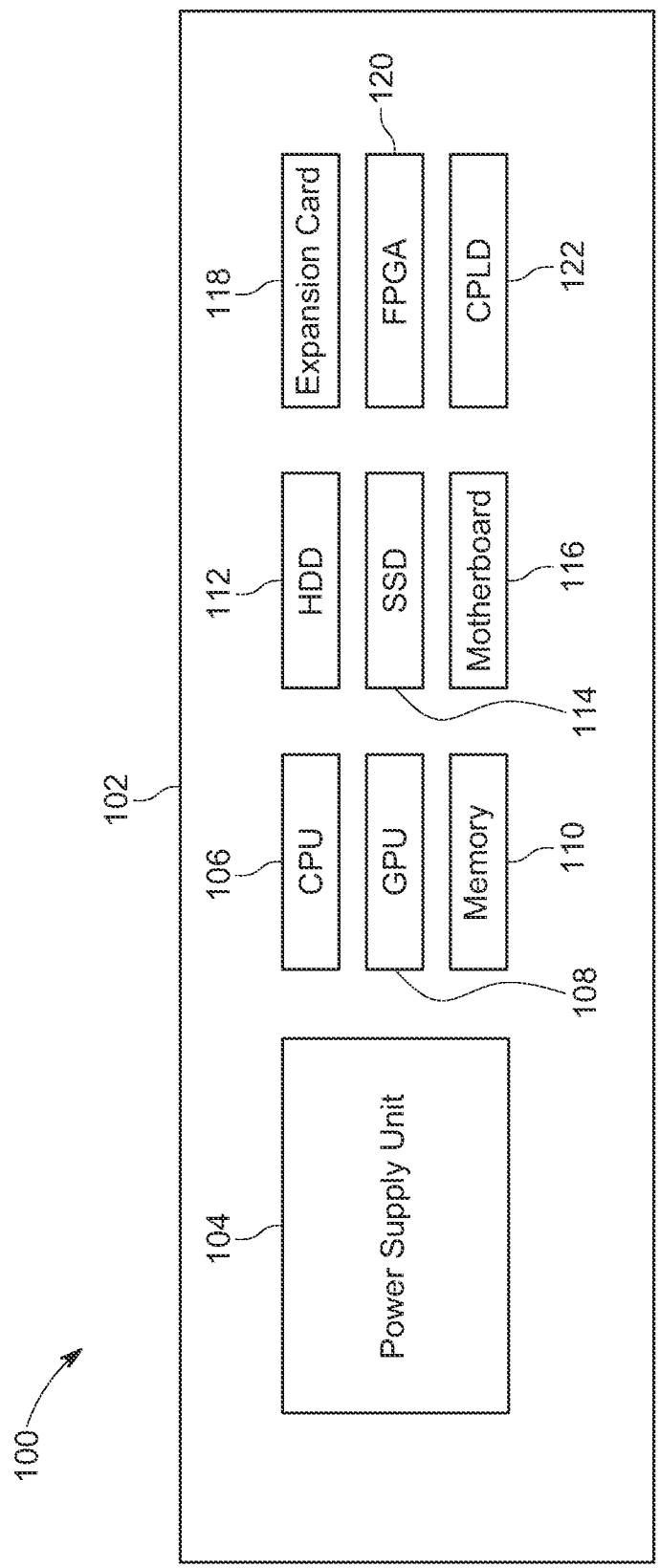
FIG. 1 is a block diagram of a computing system, according to aspects of the present disclosure.

Computing systems and computing devices, such as servers, generally include a variety of different components that are powered using a power supply unit. During design of the power supply unit, it can be dangerous to test the power supply unit with the actual system or device, due to the risk of damaging the system or device. According to aspects of the present disclosure, a test load circuit can be used to simulate the system or device in order to test the power supply unit. The test load circuit can include a test load configured to be electrically connected to a voltage source of the power supply, a current sensor configured to detect the amount of current flowing through the test load, and a comparator that compares the voltage of a command signal and the voltage of a feedback signal that is associated with the test load current. The test load has a variable resistance that is adjustable to control the test load current and cause the test load current to match a target current.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including"

means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 is a block diagram of a computing system 100, which can be a server. The computing system 100 includes a housing 102 that houses a power supply unit 104 and a variety of internal electronic components that aid in performing different functions and tasks. The electronic components can include a central processing unit (CPU) 106, a graphics processing unit (GPU) 108, one or more memory devices 110, one or more hard disk drives (HDDs) 112, one or more solid state drives (SSDs) 114, a motherboard 116, one or more expansion cards 118, a field-programmable gate array (FPGA) 120, a complex programmable logic device (CPLD) 122, or any combination of these and/or other electronic components. The power supply unit 104 is designed to be able to supply a stable voltage to the electronic components during all operating conditions of the electronic components as the computing system 100 is operated.

Figure 2:
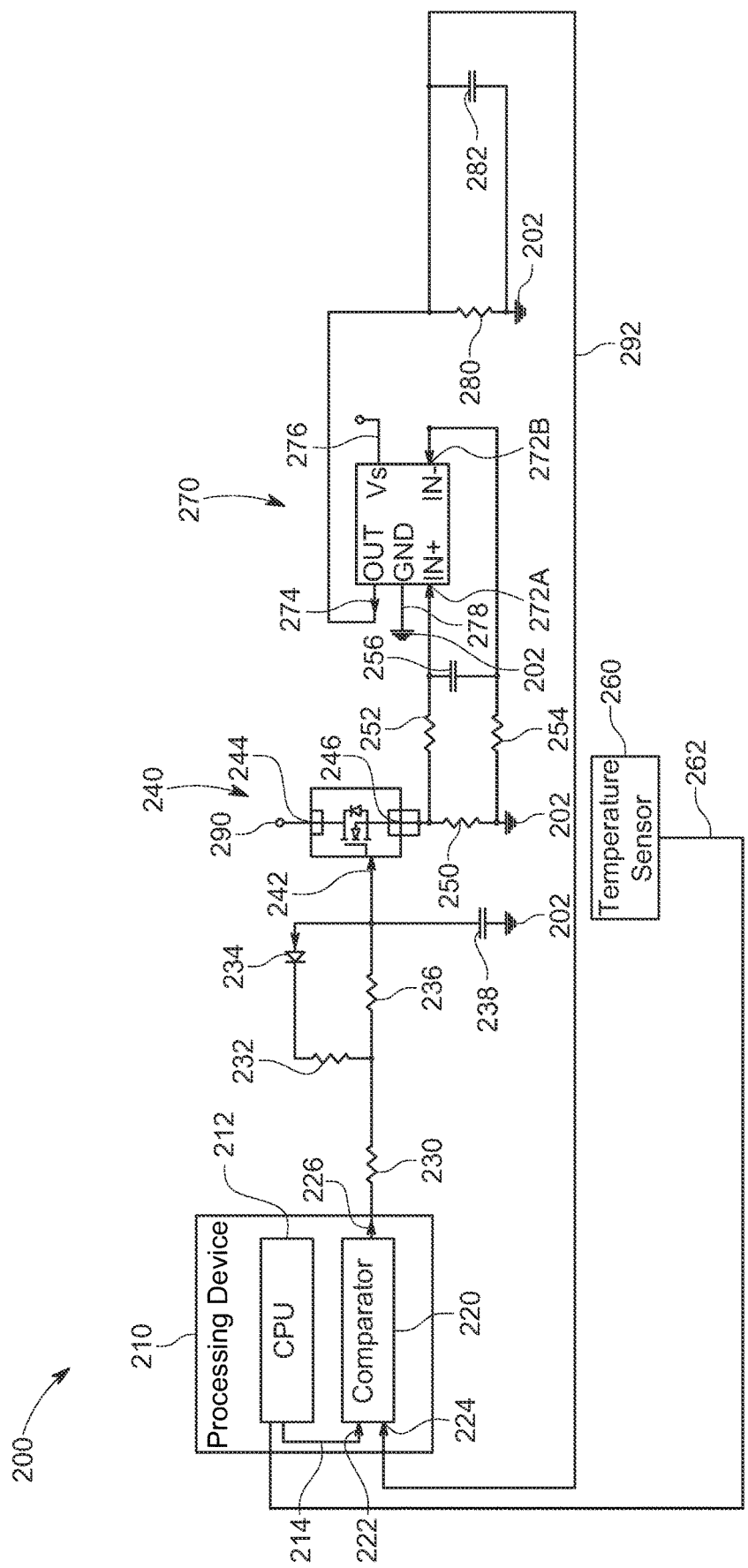
FIG. 2 is a circuit diagram of a test load circuit for testing the power supply of the computing system of FIG. 1, according to certain aspects of the present disclosure.

FIG. 2 shows a test load circuit 200 that can be used to test the power supply unit 104 of the computing system 100. The test load circuit 200 includes a processing device 210, a test load 240, a current sensor 250, and an amplifier 270. The test load circuit 200 can be operated in order to achieve a target power dissipation by the test load 240 (e.g., a power dissipation similar to that of the computing system 100), by causing a specific current to flow through the test load 240 and a specific voltage to appear across the test load 240. The current flowing through the test load 240 is referred to herein as the test load current, and the voltage across the test load 240 is referred to herein as the test load voltage. The processing device 210 is used to set a target current through the test load 240 and the target voltage across the test load 240. The target current and the target voltage will generally correspond to the target power dissipation.

The test load 240 is electrically connected to a voltage source 290 of the power supply unit being tested (e.g., the power supply unit 104 of FIG. 1). The other end of the test load 240 is electrically connected to the current sensor 250, and the other end of the current sensor 250 is electrically connected to ground 202. The test load 240 and the current sensor 250 form a voltage divider. The voltage source 290 has a known voltage, and the voltage across the test load 240 is known during operation of the test load circuit 200. The test load 240 has a variable resistance that can be adjusted so that a desired amount of current flows through test load 240, and that the voltage provide by the voltage source 290 is divided between the test load 240 and the current sensor 250 as desired. By adjusting the resistance of the test load 240, a target amount of current can be caused to flow through the test load 240 and a target voltage can be caused to be across the test load 240.

Because the voltage provided by the voltage source 290 and the resistance of the current sensor 250 are both fixed, achieving the target current through the test load 240 by adjusting the test load resistance will result in achieving the target voltage across the test load 240, and achieving the target voltage across the test load 240 by adjusting the test load resistance will result in achieving the target current through the test load 240. While the description herein generally refers to a target current through the test load 240, those of skill in the art will understand that achieving a target current through the test load 240 is generally equivalent to achieving a target voltage across the test load 240. Thus, adjusting the resistance of the test load 240 to achieve the target current and target voltage will result the target power dissipation by the test load 240. The target power dissipation $P_{tl}$ is equal to $V_{tl}*I_{tl}$, where $V_{tl}$ is the test load voltage and $I_{tl}$ is the test load current.

The current sensor 250 is configured to determine the amount of current flowing through the test load 240, which can be in turn used to determine whether the resistance of the test load 240 needs to be adjusted to achieve the target current. In some implementations, the current sensor 250 is a single resistor having a desired resistance (e.g., about 5 mΩ). In other implementations, the current sensor 250 can be formed from multiple resistors having a desired resistance (e.g., about 5 mΩ). As shown, the current sensor 250 is electrically connected in series with the test load 240, such that the same amount of current flowing through the test load 240 will also flow through the current sensor 250. Thus, in implementations where the current sensor 250 is a resistor with a known resistance $R_{cs}$, the current sensor voltage $V_{cs}$ will be associated with the test load current according to $V_{cs}=I_{tl}*R_{cs}$. By determining the current sensor voltage, it can be determined whether the test load current matches the target current, and whether the test load current needs to be adjusted.

In some implementations, the power dissipated by both the test load 240 and the current sensor 250 (which will generally be equal to $I_{tl}^2*R_{cs}$ when the current sensor is a resistor) is taken into account when determining whether the target power dissipation has been achieved. In these implementations, the target current is selected so that the total power dissipated by both the test load 240 and the current sensor 250 ($V_{tl}*I_{tl}+I_{tl}^2*R_{cs}$) is equal to the target power dissipation. In other implementations, the current sensor 250 is designed so that the power dissipated by the current sensor 250 is negligible, and can generally be ignored. For example, if the current sensor 250 is a resistor with a resistance that is small compared to the range of possible resistances of the test load 240 (e.g., 5 mΩ), then the power dissipated by the current sensor 250 will be small compared to the power dissipated by the test load 240, and can be ignored. In these implementations, the target current is selected so that the power dissipated by the test load 240 ($V_{tl}*I_{tl}$) is equal to the target power dissipation.

The test load current will generally need to be adjusted for a variety of different reasons. For example, the test load current may need to be adjusted if the target current changes (e.g., if an individual that is using the test load circuit 200 to test a power supply wishes to test the power supply with a different current/power dissipation). However, the test load current can also vary naturally over time, due to manufacturing imprecisions in the various components of the test load circuit 200, natural fluctuations in the voltage provided by the voltage source 290, etc. Thus, even if the test load current matches the target current at a given point time, the test load current will eventually deviate from the target current such that the test load 240 no longer achieves the target power dissipation.

To determine whether the test load current needs to be adjusted, the current sensor voltage is fed into the amplifier 270 to generate a feedback signal 292. As the test load current (and thus the current sensor current) changes, the current sensor voltage will also change. The change in the current sensor voltage will cause a corresponding change in the voltage of the feedback signal 292 (which is referred to herein as the feedback signal voltage). The feedback signal 292 is fed back into the processing device 210, so that the processing device 210 can adjust the resistance of the test load 240 to update the test load current. In this manner, the test load current is continually modified so as to match the target current, and to thus achieve the target power dissipation.

The processing device 210 includes a central processing unit (CPU) 212 and a comparator 220. In some implementations, the processing device 210 is a microcontroller. In other implementations, other types of processing devices can be used. The comparator 220 includes a first input 222, a second input 224, and an output 226. The first input 222 is electrically connected to the CPU 212, and receives a command signal 214 from the CPU 212. The command signal 214 has a voltage that is associated with the target current (and/or the target voltage or the target power dissipation). The voltage of the command signal 214 is referred to herein as the command signal voltage. The second input 224 is electrically connected to the feedback signal 292, which is associated with the test load current.

Generally, the processing device 210 is configured to receive a user input indicative of the target current, the target voltage, and/or the target power dissipation. For example, a user could use an input device (e.g., a keyboard, a mouse, a touch pad, a separate processing device (such as a standard computer, tablet, mobile device, etc.) that is connected to the processing device 210) to input into the processing device 210 the target current, the target voltage, and/or the target power dissipation. The CPU 212 receives the user input and adjusts the command signal voltage to correspond to the target current (and/or the target voltage or the target power dissipation) indicated by the user input. In some implementations, the command signal voltage is equal to the voltage that corresponds to the target power dissipation (e.g., the target voltage).

The output 226 of the comparator 220 is electrically connected to the test load 240, and has a voltage that is based at least in part on the voltage difference between the command signal voltage and the feedback signal voltage. The voltage of the output 226 of the comparator 220 is referred to herein as the comparator output voltage. Because the command signal voltage is associated with the target current and the feedback signal voltage is associated with the test load current, the comparator output voltage will also be based at least in part on the current difference between the target current and the test load current.

The comparator 220 is designed so that the comparator output voltage will be a logical low voltage or a logical high voltage. The output 226 of the comparator 220 operates the test load 240 to adjust the resistance of the test load, so that the test load current matches the target current. In the illustrated implementation, the test load 240 is a metal-oxide-semiconductor field-effect transistor (MOSFET) having a gate 242, a drain 244, and a source 246. The gate 242 is electrically connected to the output 226 of the comparator 220. The drain 244 is electrically connected to the voltage source 290 that is generated by the power supply unit being tested. The source 246 is electrically connected to one end of the current sensor 250, while the other end of the current sensor 250 is electrically connected to ground 202. Voltage can be applied to the gate 242 to adjust the resistance of the test load 240.

When the comparator output voltage transitions from a logical low voltage to a logical high voltage, the voltage at the gate 242 of the test load 240 will be increased, and the resistance between the drain 244 and the source 246 will decrease. This decreased resistance increases the amount of current flowing through the test load 240. When the comparator output voltage transitions from the logical high voltage to the a logical low voltage, the voltage at the gate 242 of the test load 240 will be decreased, and the resistance between the drain 244 and the source 246 will increase. This increased resistance decreases the amount of current flowing through the test load 240. Thus, if the comparator output voltage is modified, the resistance of the test load 240 can be increased or decreased. Increasing the resistance of the test load 240 will decrease the test load current, while decreasing the resistance of the test load 240 will increase the test load current.

In some implementations, the voltage at the gate 242 of the test load 240 will generally immediately increase and decrease as the comparator output voltage transitions between the logical low value and the logical high value. In other implementations however, the test load circuit 200 may include additional components that cause the voltage at the gate 242 of the test load 240 to increase or decrease more slowly as the comparator output voltage transitions. In these implementations, the test load circuit 200 can include an RC circuit electrically connected between the output 226 of the comparator 220 and the test load 240 that acts as a low-pass filter. The low-pass filter will cause the voltage at the gate 242 to slowly decrease to the logical low value when the comparator output voltage transitions to the logical low value, so that the resistance of the test load 240 will slowly increase, and the test load current will slowly decrease.

In the illustrated implementation, the RC circuit includes a resistor 236 and a capacitor 238. The resistor 236 has a first end electrically connected to the output 226 of the comparator 220, and a second end electrically connected to the gate 242 of the test load 240. The capacitor 238 has a first end electrically connected between the resistor 236 and the gate 242, and a second end electrically connected to ground 202. The RC circuit is used to ensure that the voltage at the gate 242 of the test load 240 is stable, and controls the rising time of the gate 242. In some implementations, the resistor 236 has a resistance of about 47 kΩ. In some implementations, the capacitor 238 has a capacitance of about 0.1 µF.

In some implementations, the current sensor voltage will generally be between about 0.1 mV and about 50 mV. This voltage is generally too small for the comparator 220 to be able to accurately receive and compare to the command signal 214. Thus, the amplifier 270 is used to amplify the test load voltage and form the feedback signal 292 which is generally proportional to the test load current. The feedback signal 292 is then fed back into the comparator 220. As the feedback signal voltage changes (e.g., due to the current sensor voltage changing in response to natural variance in the test load current), the comparator output voltage will also change. The changing comparator output voltage will in turn increase or decrease the resistance of the test load 240, and cause the test load current to be updated.

In the illustrated implementation, the amplifier 270 is a differential amplifier that amplifies the voltage difference between the voltages received at two inputs 272A and 272B. However, because the only voltage that is relevant in the test load circuit 200 is the current sensor voltage, one of the inputs 272A, 272B of the amplifier 270 can receive a voltage of zero volts. Thus, as shown in FIG. 2, the input 272A is electrically connected between the current sensor 250 and the source 246 of the test load 240, and the input 272B is electrically connected to ground 202. In this manner, the voltage at the input 272A is the current sensor voltage, and the voltage at the input 272B is zero volts. The feedback signal 292 is then generated at the output 274 of the amplifier 270 also includes a power pin 276 (labeled as $V_s$) that is connected to a voltage source to power the amplifier 270, and a ground pin 278 (labeled as GND) that is connected to ground 202.

If a user wishes to update the target current (and/or the target voltage or the target power dissipation), the user can provide input to the processing device 210 indicative of the new target current (and/or the new target voltage or the new target power dissipation). The CPU 212 will receive the input and adjust the command signal voltage based on the new target current. The comparator 220 will compare the new command signal voltage to the feedback signal voltage, and the comparator output voltage will adjust accordingly.

Generally, if the new target current is greater than the current test load current, the updated comparator output voltage will cause the resistance of the test load 240 to decrease (or to remain at a decreased resistance if the comparator output voltage is already at the logical low value). The decreased resistance of the test load 240 will cause the current flowing through the test load 240 and the current sensor 250 to increase until the test load current matches the new target current (e.g., until the power dissipated by the test load 240 (or the test load 240 and the current sensor 250) matches the new target power dissipation).

If the new target current is less than the current test load current, the updated comparator output voltage will cause the resistance of the test load 240 to increase (or to remain at an increase resistance if the comparator output voltage is already at the logical high value). The increased resistance of the test load 240 will cause the current flowing through the test load 240 and the current sensor 250 to decrease until the test load current matches the new target current (e.g., until the power dissipated by the test load 240 (or the test load 240 and the current sensor 250) matches the new target power dissipation).

Thus, the command signal voltage will be adjusted in response to receiving user input indicative of a new target current. In response to the command signal voltage being modified from a first voltage that is less than the feedback signal voltage to a second voltage that is greater than the feedback signal voltage, the comparator output voltage will transition from a logical low voltage to a logical high voltage. In response to the command signal voltage being modified from a first voltage that is greater than the feedback signal voltage to a second voltage that is less than the feedback signal voltage, the comparator output voltage will transition from a logical high voltage to a logical low voltage. These transitions will in turn cause the resistance of the test load 240 to increase or decrease. When the test load resistance decreases, the test load current increases to match the new target current. When the test load resistance increases, the test load current decreases to match the new target current. Finally, in response to the test load current increasing or decreasing, the current sensor voltage and the feedback signal voltage will increase or decrease, which will in turn adjust the comparator output voltage and again adjust the test load resistance to increase or decrease the test load current.

The test load circuit 200 can include a variety of other electronic components that perform various functions. In some implementations, the test load circuit 200 includes a resistor 230 electrically connected to the output 226 of the comparator 220. The resistor 230 can be used for de-bugging if the resistance in the test load circuit 200 needs to be adjusted. In some implementations, the resistor 230 has a negligence resistance. In some implementations, the test load circuit 200 includes a resistor 232 and a diode 234 electrically connected in series between the resistor 230 (or the output 226 of the comparator 220) and the gate 242 of the test load 240. The resistor 232 and the diode 234 can be used to shut down the test load 240 if needed. In some implementations, the resistor 232 has a resistance of about 1 kΩ. In some implementations, the cathode of the diode 234 is electrically connected to the resistor 232, and the anode of the diode 234 is electrically connected to the gate 242.

In some implementations, the test load circuit 200 includes an additional RC circuit electrically connected between the current sensor 250 and the amplifier 270. This RC circuit is used to reduce the noise in the current sensor voltage, so that the voltage that appears at the input 272A of the amplifier 270 is clean. In the illustrated implementation, the additional RC circuit includes a resistor 252, a resistor 254, and a capacitor 256. The resistor 252 has a first end electrically connected between the source 246 and the current sensor 250, and a second end electrically connected to the input 272A of the amplifier 270. The resistor 254 has a first end electrically connected between ground 202 and the input 272B of the amplifier 270. The capacitor 256 is coupled between the resistors 252, 254, and the inputs 272A, 272B of the amplifier 270. The capacitor 256 has a first end electrically connected between the resistor 252 and the input 272A, and a second end electrically connected between the resistor 254 and the input 272B. In some implementations, the resistor 252 and the resistor 254 each have a resistance of about 10Ω. In some implementations, the capacitor 256 has a capacitance of about 10 pF.

In some implementations, the test load circuit 200 includes additional resistors and capacitors electrically connected between the output 274 of the amplifier 270, and the CPU 212 of the processing device 210. In the illustrated implementation, these components include a resistor 280 and a capacitor 282. The resistor 280 and the capacitor 282 each have a first end electrically connected to the output 274 of the amplifier 270, and a second end connected to ground 202. The feedback signal 292 is formed at the junction of the output 274, the first end of the resistor 280, and the first end of the capacitor 282. The resistor 280 and the capacitor 282 are used to clean the feedback signal 292 and ensure that it is stable.

In some implementations, the test load circuit 200 includes temperature sensor 260 that is positioned adjacent to the test load 240 and monitors the temperature of the test load 240. The temperature sensor 260 is generally electrically isolated from the test load 240 (and the rest of the test load circuit 200), but is in thermal communication with the test load 240. The temperature sensor 260 includes an output 262 that has a voltage associated with the temperature of the test load 240. The output 262 of the temperature sensor 260 is fed back into the CPU 212 of the processing device 210, so that the processing device 210 can determine the temperature of the test load 240. If the temperature sensor 260 indicates that the test load temperature exceeds a predefined threshold temperature, the processing device 210 can modify the command signal 214 to decrease the target current (e.g., the target power dissipation), and reduce the temperature of the test load 240.

Figure 3:
FIG. 3 is a table showing the value of electrical parameters of the test load circuit of FIG. 2 for different target currents, according to certain aspects of the present disclosure.

FIG. 3 is a table 300 that shows the values of various different parameters in the test load circuit 200 for different target currents. Column 302 shows several example values of an internal command signal that is used by the CPU 212. When the CPU 212 receives input from the user indicating the target current, the CPU 212 generates the internal command signal, which is a scaled version of the voltage of the actual command signal 214 sent to the comparator 220. The processing device 210 includes components that convert the internal command signal into the command signal that is sent to the comparator 220. In the illustrated implementation, the internal command signal can have a value between 0 and 1900, where 0 indicates that the target current is at a minimum value, and 1900 indicates that the target current is at a maximum value. However, the internal command signal can generally have any suitable scale. Further, the internal command signal is shown only in increments of 100. However, the internal command signal can generally have any integer value between 0 and 1900, or any integer value on the scale that is used.

Column 304 shows the test load current (in amps) that correspond to example values of the internal command signal. For example, if the CPU 212 receives user input indicating that the target current is 0.32 amps, then the internal command signal will have a value of 100. Column 306 shows the total power dissipated by the test load circuit 200 in watts for the example values of the internal command signal. Column 308 shows the current sensor voltages (in millivolts) for the example values of the internal command signal. Column 310 shows the feedback signal voltage, e.g., the output of the amplifier 270 for the example values of the internal command signal. Due to the operation of the test load circuit 200, the feedback signal voltage is also the command signal voltage (e.g., once the command signal voltage is sent to the comparator, the test load 240 is operated to cause the test load current match the target current, so that the voltage of the resulting feedback signal is equal to the command signal voltage). Thus, column 310 shows the command signal voltage that corresponds to each example value of the internal command signal, and the resulting voltage after the current sensor voltage is amplified by the amplifier 270.

Thus, as demonstrated by table 300, the test load current, the power dissipated by the test load 240, and the current sensor voltage can all be controlled by the processing device 210, which generates a command signal based on user input received from a user.

Figure 4:
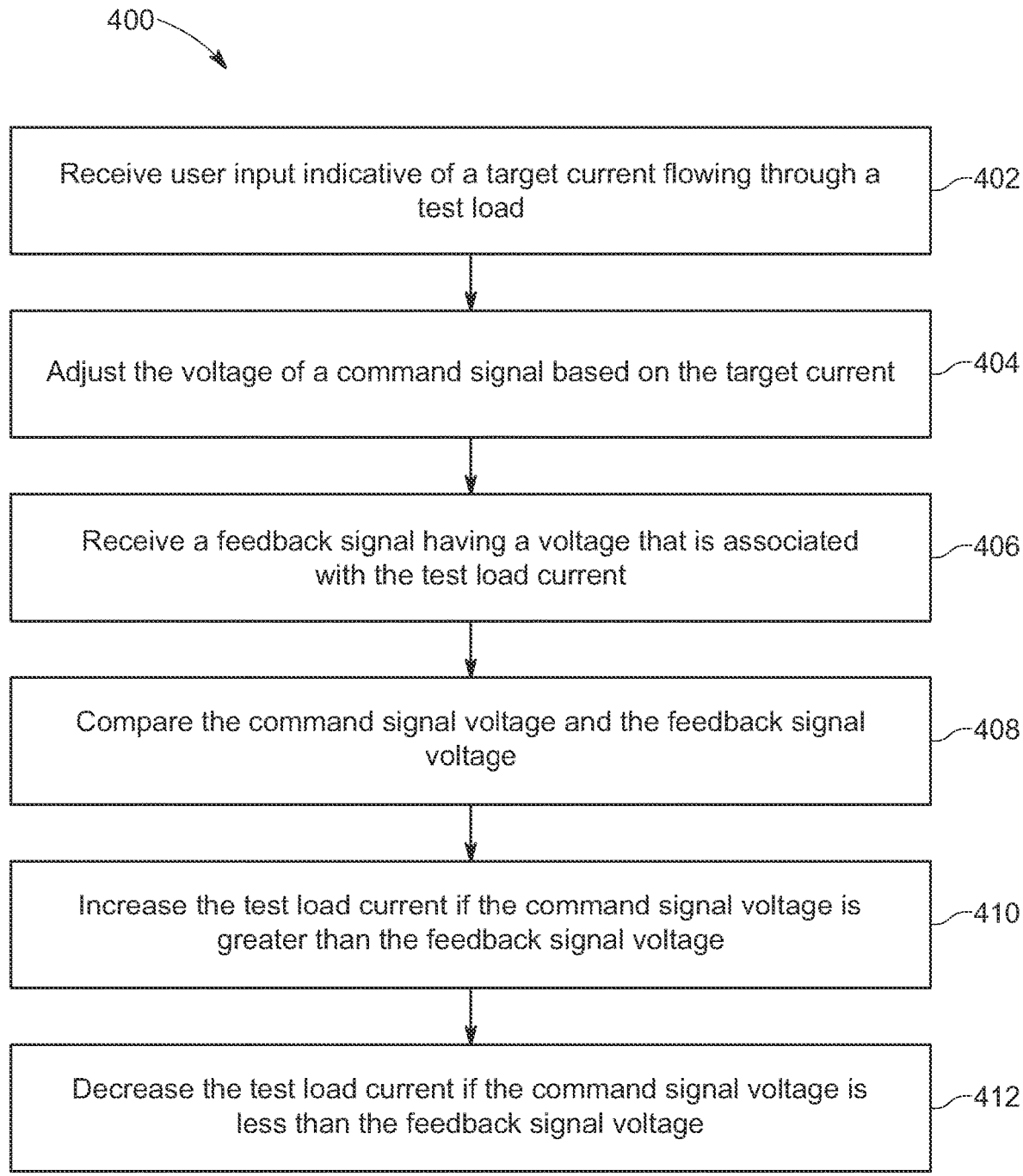
FIG. 4 is a flowchart of a method for adjusting a test load voltage across a test load, according to certain aspects of the present disclosure.

FIG. 4 shows a flowchart of a method 400 for adjusting an amount of current flowing through a test load. The method 400 can be implemented using a test load circuit, such as the test load circuit 200. Step 402 of the method 400 includes receiving user input that is indicative of a target current through the test load. The user input can be received using any suitable processing device (such as the processing device 210 of the test load circuit 200). Step 404 of the method 400 includes adjusting the voltage of a command signal based on the target current. The processing device can be used to adjust the command signal voltage based on the target current. Step 406 of the method 400 includes receiving a feedback signal that has a voltage associated with the test load current. The feedback signal can be generated using any suitable technique. For example, as discussed herein, the feedback signal can be generated by feeding the current sensor voltage into an amplifier (such as the amplifier 270) of the test load circuit 200. The processing device can be used to receive the feedback signal. Thus, in some implementations, the method 400 includes amplifying the current sensor voltage to generate the feedback signal.

Step 408 of the method 400 includes comparing the command signal voltage and the feedback signal voltage. In some implementations, a comparator (such as the comparator 220 of the test load circuit 200) is used to compare the command signal voltage and the feedback signal voltage. In some implementations, the comparator is part of the processing device. Step 410 of the method 400 includes causing the test load current to increase if the command signal voltage is greater than the feedback signal voltage (which indicates that the test load current is less than the target current). Step 412 of the method 400 includes causing the test load current to decrease if the command signal voltage is less than the feedback signal voltage (which indicates that the test load current is greater than the target current).

In some implementations, the test load current is increased or decreased by adjusting the resistance of the test load. For example, if the command signal voltage and the feedback signal voltage are compared using a comparator, the output of the comparator can be electrically connected to the test load. The voltage of the output of the comparator can increase or decrease the resistance of the test load to adjust the current flowing through the switching device and the test load, as discussed herein with respect to the test load circuit 200. In some implementations, causing the test load current to increase includes increasing the comparator output voltage applied to the test load, which causes the resistance of the test load to decrease. In some implementations, causing the test load current to decrease includes decreasing the comparator output voltage applied to the test load, which causes the resistance of the test load to increase.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A test load circuit for testing a power supply comprising:
   a test load configured to be electrically connected to a voltage source of the power supply;
   a current sensor configured to detect an amount of current flowing through the test load;
   an amplifier having an input and an output, the input being electrically connected to the test load, the amplifier being configured to amplify a voltage across the current sensor to generate a feedback signal at the output of the amplifier, the voltage across the current sensor being proportional to the test load current such that the
voltage of the feedback signal is associated with the test
load current; and
a processing device including:
a processing unit configured to generate a command
signal having a voltage that is associated with a
target current through the test load, and
a comparator having:
a first input electrically connected to the output of the
amplifier to receive feedback signal,
a second input electrically connected to the processing unit to receive the command signal, and
an output electrically connected to the test load, the
output having a voltage that is based at least in part
on a current difference between the target current
and the test load current,
wherein the test load has a variable resistance that is
controllable by the output of the comparator, and
wherein the processing unit is configured to receive a user
input indicative of the target current and to adjust a
voltage of the command signal based at least in part on
the target current to adjust test load current and cause
the test load current to match the target current.

2. The test load circuit of claim 1, wherein:
in response to the command signal voltage increasing and
indicating that the target current is greater than the test
load current, the resistance of the test load decreases
such that the test load current increases to match the
target current; and
in response to the command signal voltage decreasing and
indicating that the target current is less than the test
load current, the resistance of the test load increases
such that the test load current decrease to match the
target current.

3. The test load circuit of claim 1, wherein the command
signal voltage is adjustable to modify the comparator output
voltage.

4. The test load circuit of claim 3, wherein:
in response to the command signal voltage being modified
from a first voltage that is less than the feedback signal
voltage to a second voltage that is greater than the
feedback signal voltage, the comparator output voltage
transitions from a logical low voltage to a logical high
voltage; and
in response to the command signal voltage being modified
from a first voltage that is greater than the feedback
signal voltage to a second voltage that is less than the
feedback signal voltage, the comparator output voltage
transitions from a logical high voltage to a logical low
voltage.

5. The test load circuit of claim 3, wherein the command
signal voltage is adjustable to transition the comparator
output voltage between a logical high voltage and a logical
low voltage.

6. The test load circuit of claim 5, wherein in response to
the comparator output voltage transitioning between the
logical high voltage and the logical low voltage, the resistance of the test load increases or decreases.

7. The test load circuit of claim 6, wherein:
in response to the comparator output voltage transitioning
from the logical low voltage to the logical high voltage,
the resistance of the test load decreases; and
in response to the comparator output voltage transitioning
from the logical high voltage to the logical low voltage,
the resistance of the test load increases.

8. The test load circuit of claim 6, wherein in response to
the resistance of the test load increasing or decreasing, the
test load current increases or decreases.

9. The test load circuit of claim 8, wherein:
in response to the resistance of the test load decreasing,
the test load current increases; and
in response to the resistance of the test load increasing, the
test load current decreases.

10. The test load circuit of claim 8, wherein in response
to the test load current increasing or decreasing, the feedback signal voltage increases or decreases.

11. The test load circuit of claim 10, wherein:
in response to the feedback signal voltage increasing
above the command signal voltage, the resistance of the
test load increases such that the test load current
decreases to match the target current voltage; and
in response to the feedback signal voltage decreasing
below the command signal voltage, the resistance of
the test load decreases such that the test load current
increases to match the target current.

12. The test load circuit of claim 1, wherein the test load
is a metal-oxide-semiconductor field-effect transistor (MOSFET), the MOSFET including a gate that is electrically
connected to the output of the comparator such that the
output of the comparator is controllable to adjust the resistance of the MOSFET.

13. The test load circuit of claim 1, further comprising a
temperature sensor electrically connected to the processing
device and electrically isolated from the test load and the
comparator of the processing device, the temperature sensor
being positioned adjacent to the test load and configured to
monitor a temperature of the test load, the processing unit
being configured to decrease the command signal voltage in
response to the test load temperature being greater than a
threshold temperature.

14. The test load circuit of claim 1, wherein the voltage
source has a known voltage, and wherein the target current
is determined based on the voltage of the voltage source and
a target power dissipation of the test load.

15. A method for adjusting an amount of current flowing
through a test load, the method comprising:
receiving, via a processing device, user input indicative of
a target current through the test load;
adjusting, using the processing device, a voltage of a
command signal based at least in part on the target
current;
determining a voltage across a current sensor that is
electrically connected to the test load, the current
sensor voltage being associated with the test load
current;
amplifying the current sensor voltage to generate the
feedback signal;
receiving a feedback signal, the feedback signal having a
voltage that is associated with the test load current;
comparing, via a comparator of the processing device, the
command signal voltage to the feedback signal voltage;
in response to the command signal voltage being greater
than the feedback signal voltage, causing the test load
current to increase; and
in response to the command signal voltage being less than
the feedback signal voltage, causing the test load current to decrease.

16. The method of claim 15, wherein causing the test load
current to increase includes increasing a voltage applied to
the test load to cause a resistance of the test load to decrease.

17. The method of claim 15, wherein causing the test load current to decrease includes decreasing a voltage applied to the test load to cause a resistance of the test load to increase.

18. The method of claim 17, further comprising:
generating, via a temperature sensor that is electrically connected to the processing device and electrically isolated from the test load and the comparator of the processing device, a temperature of the test load; and
in response to the temperature of the test load being greater than a threshold temperature, decreasing, via the processing device, the command signal voltage.

* * * * *